United States Patent [19]

Berry

[11] 3,959,557

[45] May 25, 1976

[54] WEAR-RESISTANT, NONABRADING TIC ARTICLE AND PROCESS FOR MAKING

[75] Inventor: Alan R. Berry, Lake Elmo, Minn.

[73] Assignee: Minnesota Mining and Manufacturing Company, St. Paul, Minn.

[22] Filed: Nov. 4, 1974

[21] Appl. No.: 520,359

[52] U.S. Cl. .............................. 428/368; 57/106; 427/248; 427/249; 427/295; 427/419; 428/369; 428/371; 428/380; 428/389; 428/457; 428/539

[51] Int. Cl.² .................... C23C 11/08; B32B 15/04

[58] Field of Search ......... 427/248, 249, 419, 295; 428/369, 371, 367, 368, 389, 380, 457, 539; 57/106

[56] References Cited

UNITED STATES PATENTS

| 2,836,514 | 5/1958 | Munster et al. .................. 427/249 X |
| 2,962,388 | 11/1960 | Ruppert et al. ...................... 427/249 |
| 2,962,399 | 11/1960 | Ruppert et al. .................. 427/249 X |
| 3,344,595 | 10/1967 | Johnson ................................ 57/106 |
| 3,623,312 | 11/1971 | Gutbrod .......................... 57/106 X |
| 3,640,689 | 2/1972 | Glaski et al. .................. 427/249 X |
| 3,642,522 | 2/1972 | Gass et al. ......................... 427/249 |
| 3,721,577 | 3/1973 | Woerner ........................... 427/249 |
| 3,832,221 | 8/1974 | Ekemar ............................ 427/249 |

OTHER PUBLICATIONS

Synielnnikowa et al., Journal of the Less-Common Metals, Vol. 23, No. 1 (1971) pp. 1-6.

*Primary Examiner*—Ralph Husack
*Attorney, Agent, or Firm*—Alexander, Sell, Steldt & DeLaHunt

[57] ABSTRACT

A wear-resistant, nonabrasive metal article, such as a thread guide, comprising a plain carbon steel substrate with a thin, dense, continuous coating of titanium nitride, having a thickness of about 1 to 5 microns, chemically vapor deposited at reduced pressure on said steel substrate, and preferably a thin, continuous, smooth, titanium carbide coating, having a thickness of about 5 to 25 microns, chemically vapor deposited at reduced pressure on said nitride coating, the carbide coating having $HK_{50}$ hardness of 3600 to 3900 and a surface finish of 0.2 to 0.5 micron.

13 Claims, 5 Drawing Figures

U.S. Patent  May 25, 1976  3,959,557
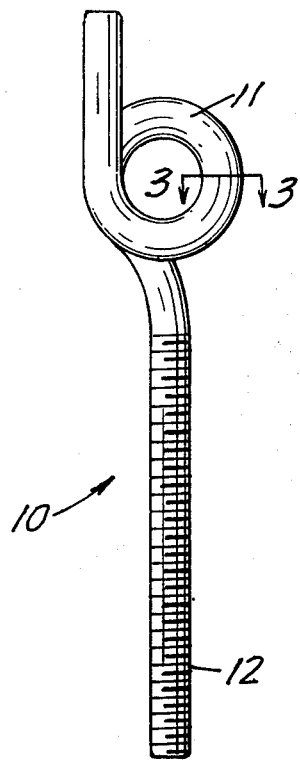
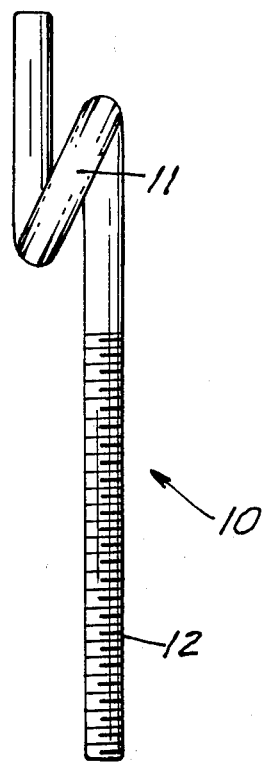
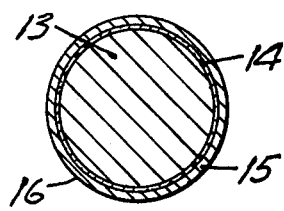
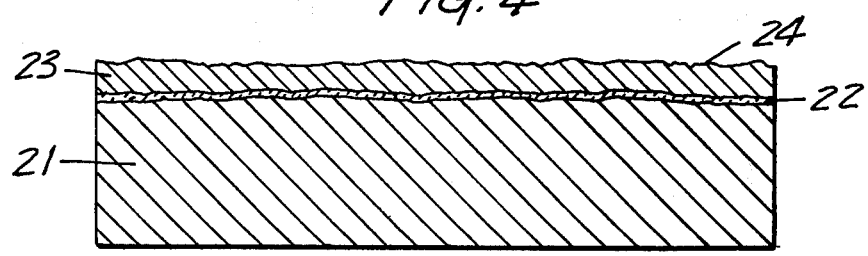
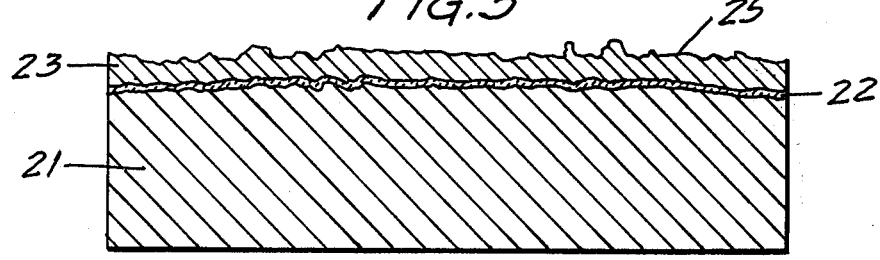

WEAR-RESISTANT, NONABRADING TIC ARTICLE AND PROCESS FOR MAKING

In one aspect, this invention relates to plain carbon steel articles having a wear-resistant coating of titanium nitride, preferably over-coated with titanium carbide, on the working surface thereof. In another aspect, it relates to a process for chemically vapor depositing titanium carbide coatings on the working surfaces of plain carbon steel articles.

The coating of carbide articles, such as carbide cutting tools, with titanium nitride, titanium carbide or various other nitride, boride or silicide refractory coatings, for purposes of improving the mechanical properties thereof, is widely practiced in the art, reliance most often being made on the presence of carbon in the carbide substrate to promote the formation of the desired carbide on the surface of the article.

In the fabrication of wear-resistant steel articles such as gears, U.S. Pat. No. 2,836,514 (Munster et al) discloses chemical vapor deposition of titanium nitride followed by the deposition of titanium carbide on steel substrates. However, Munster et al do not disclose any operating conditions for forming such coatings nor the specific steel so coated nor the smoothness of the coatings.

U.S. Pat. No. 2,962,388 (Ruppert et al) discloses the chemical vapor deposition at atmospheric or superatmospheric pressure of titanium carbide on an alloy steel substrate, this process requiring the presence of carbon or chromium to promote the deposition. The resulting coating is said to have a fine, uniform grain structure and a relatively smooth surface; however, the best surface finish obtained is said to be only about 1 to 2 microns.

U.S. Pat. No. 3,640,689 (Glaski et al) discloses a method of chemical vapor deposition at reduced pressures where an intermediate layer is placed between a hard metal carbide substrate to be coated and the hard metal carbide layer coated on said substrate.

The present invention produces wear-resistant plain carbon steel articles, such as thread guides, having a thin (1 to 5 microns), dense, smooth, continuous coating of titanium nitride coated on the working surfaces of the article, said titanium nitride coating preferably being over-coated with a relatively thicker (5 to 25 microns) yet thin, dense, relatively smooth, continuous coating of titanium carbide. These coated articles are produced by chemical vapor deposition (commonly abbreviated "CVD") at reduced pressures on the surface of the plain carbon steel. Where the deposited titanium nitride is over-coated with titanium carbide, deposition of the latter is followed by contact of the same with a reducing gas, such as hydrogen, mixed with a small amount of a gaseous titanium (IV) halide, such as titanium tetrachloride, to increase the hardness to a value exceeding about 3600 $HK_{50}$, generally to about 3900 $HK_{50}$, and to promote a bright smooth surface on the titanium carbide coating.

Referring to the accompanying drawing:

FIG. 1 is a front view of a pig-tail thread guide coated according to this invention;

FIG. 2 is a side view of FIG. 1;

FIG. 3 is a cross-section through FIG. 1 taken along the plane 3—3;

FIG. 4 is a pen-and-ink sketch on the same scale of a photomicrograph (750X) of a cross-section of a plain carbon steel substrate having a titanium carbide coating deposited on a titanium nitride coating, said coatings being deposited at reduced pressure in accordance with this invention; and FIG. 5 is a sketch like FIG. 4 except that both coatings were deposited at atmospheric pressure.

In the drawing, FIGS. 1 to 3 represent a pig-tail thread guide 10 useful for guiding textile threads in various winding and weaving operations. In use, the thread being guided is passed through the loop 11 of the guide 10. The guide 10 is threaded at its lower end 12 to permit the guide to be held in position in a threaded bore at the desired location in the operation. The core 13 of the guide 10 consists essentially of plain carbon steel with a titanium nitride layer 14 coated thereon. The titanium nitride layer 14 can in turn be coated with a layer 15 of titanium carbide, the surface 16 of which is the working surface of the guide 10.

As is customary in chemical vapor deposition procedures, the surface of the plain carbon steel article to be coated in accordance with this invention can be, if necessary, first polished to the surface smoothness desired in the final coated article, such as by grinding with diamond or other fine abrasives, electropolishing or vibratory polishing. In electropolishing, a clean article is connected to the positive terminal of a direct current power supply to form an anode which is inserted into a polishing solution that serves as an electrolyte. A suitable cathode is inserted into the electrolyte and the current allowed to flow. Because a differential resistance gradient is formed at the surface of the anode, metal from ridges or small projections on the anode surface will dissolve into the electrolyte faster than the material from other portions of the anode. Thus, there is a tendency for the surface to gradually smoothen out and polish to a very fine finish.

Vibratory finishing can also be used as a polishing technique. Such finishing can be done by placing the article to be polished in a large bowl or container with fine abrasive grit, e.g., alumina or silicon carbide having a mesh size of —325 (0.044 mm sieve openings) or less. The bowl and contents are then vibrated by displacing the bowl a small amount, e.g., 0.1–1 cm at a rate of 900 to 2500 cycles per minute. The polishing with loose abrasive forms a fine finish on the article.

The resulting polished article can then be cleaned, such as by washing with a detergent or solvent to remove grease, cutting oils and other foreign materials present on the surface.

In addition to cleaning, the article is subjected to vacuum degasification prior to coating. This can be done by placing the article in a furnace maintained under reduced pressures of less than 250 Torr, generally less than 30 Torr. The article is then heated to 500 to 700°C under vacuum for about 10 to 30 minutes. Degasification occurs more rapidly and more completely at lower pressures and higher temperatures. The degasification prevents the formation of unwanted oxides at the interface between the article substrate and the subsequently applied coating so as to aid formation of a good metallurgical bond between the coating and the substrate.

A metallurgical bond is a bond between two metal parts caused by interatomic diffusion resulting from heating. Degasification as described removes gases adhering to the surface of the substrate and also removes gases which were dissolved in the substrate material when the material was molten. Particulaly, this process removes oxygen and nitrogen which can interfere with proper coating. If these gases are not removed from the substrate, they have a tendency to diffuse to the surface of the substrate during coating and react with the coating material which has been deposited. This results in thin, intermediate layers of undesirable compositions, e.g., oxides, nitrides, carbonitrides, which reduce the adherence of the deposited coating to the substrate.

After degasification, the working surface of the article which is to be coated is reduced by exposing the surface of the article to hydrogen at an elevated temperature of 500° to 1100°C and at a pressure of approximately 20 to 760 Torr. Reduction will usually be carried out for 10 to 30 minutes. The higher the temperature, the shorter the time required for the reduction, and vice versa. This step substantially reduces any oxides present on the surface, such oxides generally being present on even the most carefully prepared and polished surface.

The degased and reduced article is then coated to provide a thin, continuous, adherent titanium nitride layer. This is accomplished by exposing the article to a gaseous mixture containing a titanium (IV) halide, e.g., titanium tetrachloride. Stoichiometric quantities of titanium tetrachloride and nitrogen are mixed with excess hydrogen to form a titanium nitride coating mixture; the conventional reaction being:

$$TiCl_4 + \tfrac{1}{2} N_2 + 2H_2 \rightarrow TiN + 4HCl \qquad I$$

The gaseous reactant can be mixed in the proper quantities by bubbling a mixture of nitrogen and hydrogen through liquid titanium (IV) halide. When titanium tetrachloride is used, the bubbling is conveniently done at room temperature since titanium tetrachloride is a liquid at normal room temperature (24°C). The resulting gaseous mixture provides the proper quantities of reactants. Suitable titanium tetrahalides include titanium (IV) chloride, bromide and iodide. Titanium tetrachloride is preferred because it is liquid at room temperature and relatively inexpensive.

The chemical vapor deposition reaction designated I above generally takes place at temperatures of 600° to 1100°C and, advantageously, at reduced pressures generally in the range of 50 to 250 Torr, and preferably 50 to 150 Torr to provide the best combination of surface finish and coating rate. The coating time will generally be 10 to 60 minutes, the longer reaction times being required at lower temperatures and pressures and vice versa. The resulting coated article is a plain carbon steel substrate having a continuous layer of dense, uniform, fine grained, chemically vapor-deposited titanium nitride metallurgically bonded to the substrate. The chemical vapor deposition produces a uniform thickness of about 1 to 5 microns and extremely fine grains. Thicker coatings are unnecessary and if the coating is too thick, e.g., 25 microns, spalling will very likely occur. Most of the grain diameters are on the order of 0.5 micron or less with some grains ranging up to one-half the thickness of the coating as determined by etching and observation with an optical microscope. The nitride coating will be nonporous and substantially free of foreign materials, that is, the coating is essentially pure titanium nitride. It will generally have a hardness of about 2000 $HK_{50}$ and a smoothness of 0.4 to 0.5 micron. The nitrided article can be cooled to room temperature under a neutral atmosphere, e.g., nitrogen or hydrogen. The resulting article is plain carbon steel coated with a dense, thin, smooth layer or titanium nitride.

Preferably, after the plain carbon steel substrate has been coated with titanium nitride, a hard, wear-resistant layer of titanium carbide is coated over the titanium nitride coating. This can be done by chemically vapor depositing the carbide on the nitride coating. The gaseous mixture used for carbide deposition contains stoichiometric amounts of titanium (IV) halide, e.g., titanium tetrachloride and a hydrocarbon and sufficient hydrogen to prevent occlusion of free carbon in the carbide coating. The hydrocarbons useful in the practice of this invention are low molecular weight hydrocarbons including normally gaseous alkanes, e.g., methane, ethane, propane, etc. The hydrocarbon generally preferred for use in this invention is methane because of its predictable behavior in the coating reaction, that is, it is converted exclusively to carbon and hydrogen. The reaction can be illustrated thus:

$$TiCl_4 + CH_4 \xrightarrow{H_2} TiC + 4HCl$$

The hydrogen present in the gaseous mixture acts as a carrier and also minimizes formation of free carbon in the coating (see U.S. Pat. No. 2,962,388 supra for a detailed discussion of the function of the hydrogen gas).

The carbide deposition step of this invention is carried out at an elevated temperature of 950° to 1200°C, preferably 1000° to 1100°C. This provides a good deposition rate and the temperature is not too high to deleteriously affect the substrate's physical properties. Also, the deposition is carried out at a reduced pressure of approximately 50 to 250 Torr and, advantageously, preferably 50 to 150 Torr to form a smoother surface. The time taken to provide a dense (that is, nonporous), continuous layer of titanium carbide of sufficient thickness (5 to 25 microns) on the nitrided surface will generally be 30 to 180 minutes. When operating at a temperature of about 1100°C and a pressure of 100 Torr, a layer of titanium carbide, 8 to 10 microns thick, will generally be deposited in about 120 minutes.

The titanium carbide layer resulting from the coating will be metallurgically bonded to the titanium nitride layer by a thin diffusion layer. The chemically vapor deposited carbide layer will be essentially pure titanium carbide having a uniform grain size of 2 microns or less. Generally, when the grain size of the titanium carbide is observed using an optical microscope, substantially all the grains will be on the order of 0.5 micron or less.

After the desired thickness of titanium carbide has been deposited on the titanium nitride, rather than merely allowing the article to cool down in the presence of hydrogen (as is done conventionally), the flow of the hydrocarbon component of the gaseous mixture is stopped and the flow of titanium tetrahalide and hydrogen are maintained at a temperature in the range of 950° to 1200°C for an additional 10 to 90 minutes. This finishing step provides a hard, bright, smooth, uniform surface finish to the deposited titanium carbide layer by essentially eliminating any elemental carbon which is present in the titanium carbide layer. Thus, the resulting pure titanium carbide layer is now essentially free from any elemental carbon which would normally be present and undesirably affect the surface finish and decrease hardness.

The titanium carbide layer coated by the process of this invention has a hardness of approximately 3600 to 3900 $HK_{50}$. The smoothness (or surface finish) of the carbide coated, laminated article is equal to or better than the smoothness of the uncoated article. Smoothness of the carbide layer is on the order of 0.2 to 0.5 micron.

As noted hereinbefore, the coating steps of the foregoing process are carried out at pressures below atmospheric pressure (generally about 760 Torr). This is done because the deposited surface finish varies markedly with the deposition pressure. Articles coated at low pressures, e.g., from 50 to 250 Torr or somewhat higher, have essentially the same surface finish as the original uncoated article whereas materials coated at about 760 Torr tend to be rough. Thus, the process of this invention enables production of a titanium carbide coating on a plain carbon steel which has the same surface finish as the original uncoated article.

The steels used as substrates in this invention are hypoeutectic steels commonly known in the art as plain or low carbon or "mild" carbon steels. Such steels consist essentially of iron and small amounts of carbon, generally about 0.10 to 0.80 weight percent carbon. These steels are commonly known in the art as the AISI 1000 series and carry AISI designations such as 1010, 1020, 1040, 1070 and 1080. These steels will normally have small or trace amounts of other elements, such as copper, sulfur manganese, chromium, tin and vanadium contained therein, such elements being essentially impurities present in such small amounts that they neither assist or hinder in the development of a titanium nitride or titanium carbide coating on the surface of the steel.

Coated articles of this invention include pig-tail guides for guiding synthetic yarn during processing, gears, punches, dies, cutting tools and fish line guides in the manufacture of fishing rods. The coated articles have a very smooth surface which will not abrade yarn passing across the coated surface and is resistant to the abrasive action of such yarns.

Basically in measuring surface texture or finish, a stylus attached to a moving arm is moved in a straight line over the surface to be measured. The vertical movement of the stylus over the peaks and valleys of the surface is picked up and amplified electronically. A center line for the surface being measured is determined, the areas of the surface profile above and below said center line being equal. The surface texture, sometimes abbreviated "Ra", is defined as the average value of the departures of the stylus from the center line as it passes over the peaks and valleys while moving a prescribed length. The results are electronically processed and the Ra value is displayed directly on a meter in units such as microinches or microns. One machine suitable for measuring surface texture or finish is the Taylor-Hobson Surtronic 2 (available from David Olson Company, Saint Paul, Minn.). Surface measurements in the examples described below were made using this instrument.

The hardnesses referred to in this application are Knoop hardness values which are obtained using a Knoop diamond indentor and a 50 gram load. Further information on the test procedure for obtaining such hardness values is given in *Principles of Metallographic Laboratory Practice*, Kehl, John Wiley & Sons, N.Y., N.Y. (1949), pp 245 to 249.

A further understanding can be had by reference to the following examples in which all parts are by weight unless otherwise specified. The particular amounts or materials cited in these examples, as well as other conditions and details, should not be construed to limit the scope of this invention.

EXAMPLE I

A first set of threaded guides formed of AISI 1015 plain carbon steel, having a configuration similar to FIG. 1, were coated with TiN and TiC in accordance with this invention. The guides were formed from wire rods having a diameter of approximately 0.3 cm and were approximately 8 cm in length. The guides were connected to the positive terminal of a 10 volt d.c. power supply and immersed in about 800 ml of "Ionetic" electropolishing solution contained in a 1000 ml beaker. A stainless steel strip was inserted to act as a cathode.

The system was stirred by means of a magnetic stirring bar while being heated to about 80°C. The current was applied for 1 minute. The electropolished guides were rinsed in deionized water and transferred to a molybdenum tray. The tray with the guides therein was inserted into a molybdenum susceptor (having a volume of about 1 liter) in a 50 kilowatt "Tocco" vacuum induction furnace. The furnace was evacuated to 50 Torr and the temperature raised to 650°C with the vacuum being maintained at 0.02 Torr. Heating under the reduced pressure was continued for about 30 minutes to degas the furnace and guides. The evacuation was discontinued and hydrogen admitted to the furnace at a rate of approximately 9 moles per hour and the temperature raised to 1100°C. This reducing operation was continued for 30 minutes at atmospheric pressure.

Nitrogen, at a rate of 0.03 mole per hour. was fed into the hydrogen stream which was maintained at a flow rate of about 9 moles per hour. The gaseous mixture of nitrogen and hydrogen was then bubbled through liquid titanium tetrachloride maintained at room temperature in two standard drying towers connected in series (6 cm in diameter and 20 cm in height) and the resulting gaseous mixture (saturated with vaporized titanium tetrachloride) was introduced into the furnace. The flow rate of vaporous titanium tetrachloride (in the gaseous mixture) was 0.07 mole per hour.

The temperature of the furnace was maintained at about 1100°C as the gaseous mixture was passed through the furnace and the pressure in the furnace was reduced and maintained by continuous evacuation at approximately 100 Torr. The chemical vapor deposition was carried on for 30 minutes at 1100°C to provide a titanium nitride coating 2 microns in thickness, having an estimated surface finish of 0.4 to 0.5 micron and an estimated hardness of 2000 $HK_{50}$.

After deposition of the TiN, the flow of nitrogen was terminated and methane then fed into the hydrogen gas stream at a flow rate of 0.07 mole per hour. The resulting mixture of hydrogen and methane was bubbled through the liquid titanium tetrachloride to form a second gaseous mixture of titanium tetrachloride, hydrogen and methane. The second gaseous mixture was passed through the furnace at 1100°C for 2 hours at a reduced pressure of 100 Torr to provide a titanium carbide over coat having a thickness of 8 microns and an estimated surface finish of 0.9 to 1 micron.

The methane flow was terminated and only hydrogen bubbled through the titanium tetrachloride, forming a gaseous mixture of hydrogen and titanium tetrachloride which was fed into the furnace for a period of 30 minutes at a temperature of 1100°C and a pressure of 100 Torr to provide a bright, clean, finished surface.

The furnace was allowed to cool to room temperature in the presence of a hydrogen flow which bypassed the titanium tetrachloride liquid. During cooling, the evacuation was stopped and the pressure of the hydrogen allowed to increase to atmospheric pressure. When the furnace was cooled to room temperature, the hydrogen flow was terminated, the furnace evacuated to remove the hydrogen and nitrogen was back filled into the furnace. The furnace was opened and the coated thread guides were removed.

The original plain carbon steel guides before coating had a surface roughness of 0.4 to 0.5 micron. After the coating of the intermediate titanium nitride and the top-coated titanium carbide, the surface finish of the finished article was still 0.4 to 0.5 micron and surface hardness measured was 3600 to 3900 $HK_{50}$. Upon metallographic examination of the finished thread guides, the aforementioned thicknesses for the coating was measured and both coatings were found to be dense and continuous, the top coat being bright, smooth and free of carbonaceous residue.

A second set of plain carbon steel thread guides were similarly polished, cleaned, degased, reduced, coated and finished for purposes of comparison. The difference in processing was that the pressures in the furnace of the gaseous mixture of titanium tetrachloride, nitrogen and hydrogen for the nitriding step, and the gaseous mixture of titanium tetrachloride, methane and hydrogen for the carbiding step were maintained at atmospheric pressure. The guides of the second set had an original surface finish of 0.4 to 0.5 micron before coating; however, after coating with titanium nitride and titanium carbide, the surface finish was approximately 1.0 to 1.5 microns. The final surface hardness was 3600 to 3900 $HK_{50}$. These results show that the pressure of the gas used during nitriding and carbiding has a significant affect on the surface finish produced. A pressure near or above the atmospheric leads to a coating which is considerably rougher than the underlying substrate. This phenomenon is illustrated by the photomicrographic sketches in FIGS. 4 and 5 where 21 designates the plain carbon steel substrate, 22 the titanium nitride intermediate layer, and 23 the titanium carbide over-coat. FIG. 4 represents the coated thread guides prepared at low CVD pressures while FIG. 5 represents the coated thread guides prepared as described above using atmospheric pressure during CVD. Note that the surface 24 of FIG. 4 is much smoother than the corresponding surface 25 of FIG. 5.

A third set of plain carbon steel pig-tail thread guides was cleaned, polished, degased, reduced, and coated with titanium nitride and titanium carbide in the same manner as the first set of guides. However, the finishing step of treating with titanium chloride and hydrogen was omitted. The resulting titanium carbide coated guides had a surface hardness of only 2600–2800 $HK_{50}$ and a rough carbonaceous film adhered to the surface of the coated guides. These results show the finishing step provides a cleaner, smoother surface of superior hardness.

A fourth set of pig-tail thread guides formed of AISI 1041 were cleaned, electropolished, degased, reduced and coated with titanium carbide in the same manner as the first set of guides except the nitriding step was omitted. The resulting titanium carbide layer was only 1 to 2 microns thick and the surface hardness was 409 $HK_{50}$. These results show that the absence of a TiN layer on the plain carbon substrate results in a poor carbide deposition rate and an inferior carbide coating. Even a poor TiC coating should have a hardness greater than 2000 $NK_{50}$.

EXAMPLE II

Two plain carbon steel fish line guides formed from AISI 1015 (having about 0.15 percent carbon) were polished and cleaned as in Example I. The guides were coated with a titanium nitride intermediate layer and a titanium carbide over coat as the first set of thread guides in Example I.

The surface hardness of the finished fish line guides was approximately 3600 to 3900 $HK_{50}$ and had a surface finish of about 0.2–0.3 microns.

The fish line guides were tested by passing through the guides a floating fly fishing line (filled with glass beads) availabe as "Air Cel" from Scientific Anglers, Inc. The guides were tested for 27,000 cycles. Each cycle comprises passing a 10 cm length of line across the guide surface; 27,000 cycles is normally considered the life of a guide and a guide which can withstand 27,000 cycles without showing significant wear is considered an acceptable product. The guides prepared by this example showed no significant wear at 27,000 cycles and the results were equivalent to results from known fish line guides prepared from tungsten carbide-cobalt hard metal alloys.

EXAMPLE III

A set of pig-tail guides was cleaned, electropolished, degased, reduced and plated with titanium nitride in the same manner as the first set of guides in Example I. The nitriding step was, however, carried out for a period of 6 hours rather than the 30 minute nitriding of Example I. The nitrided guides were cooled to room temperature as in Example I. The coated guides had a dense, uniform golden coating of TiN about 2000 $HK_{50}$ and a surface finish of about 0.4–0.5 micron.

Various modifications and alterations will become obvious to those skilled in the art without departing from the scope and spirit of this invention and it is to be understood that the invention is not limited to the illustrative embodiments set forth herein.

What is claimed is:

1. A process for forming a chemically vapor coated finished metal article having a wear-resistant working surface, comprising the steps of:

exposing the reduced working surface of a plain carbon steel article at a pressure of 50 to 250 Torr and elevated temperature of 600° to 1100°C to a gaseous mixture containing hydrogen and stoichiometric quantites of titanium (IV) halide gas and nitrogen sufficient to form a chemically vapor deposited continuous layer of titanium nitride on said reduced surface, said plain carbon steel article being essentially free of carbide forming elements; and
   cooling the coated article to room temperature in an inert atmosphere to prevent reaction of the nitride layer with the atmosphere.

2. A process for forming a chemically vapor coated finished metal article having a wear-resistant working surface, comprising the steps of:

exposing the reduced working surface of a plain carbon steel article at a pressure of 50 to 250 Torr and elevated temperature of 600° – 1100°C to a gaseous mixture containing stoichiometric quantities of titanium (IV) halide gas and nitrogen in hydrogen sufficient to form a chemically vapor deposited continuous layer of titanium nitride on said reduced surface, said plain carbon steel article being essentially free of carbide forming elements;

exposing the resulting nitrided surface at a pressure of 50 to 250 Torr and elevated temperature of 950° – 1200°C to a mixture of gases containing stoichiometric amounts of titanium (IV) halide gas and hydrocarbon gas in hydrogen sufficient to form a chemical vapor deposited, continuous wear-resistant layer of titanium carbide on said nitrided surface and metallurgically bonded thereto;

exposing the deposited carbide layer to a mixture of the titanium halide and hydrogen for a sufficient period of time to increase the hardness and smoothness of said deposited carbide; and cooling the resulting coated article to room temperature in an inert atmosphere to prevent reaction of the carbide layer with the atmosphere.

3. The process of claim 2 where said titanium (IV) halide is titanium tetrachloride.

4. The process of claim 2 where said hydrocarbon is methane.

5. The process of claim 2 where the nitriding step is performed at 50 to 150 Torr.

6. The process of claim 2 where the carbiding step is performed at 50 to 150 Torr.

7. A laminated wear-resistant article comprising:
a plain carbon steel substrate having no more than 0.8 weight percent carbon and essentially free of carbide forming elements; and
a thin, dense, continuous coating of titanium nitride having a thickness of about 1 to 5 microns and a Knoop hardness of about 2000 $HK_{50}$ deposited on and metallurgically bonded to said substrate.

8. A laminated wear-resistant article comprising:
a plain carbon steel substrate having no more than 0.8 weight percent carbon and essentially free of carbide forming elements;
a thin, dense, continuous coating of titanium nitride having a thickness of about 1 to 5 microns deposited on and metallurgically bonded to said substrate; and
a thin, continuous, smooth titanium carbide coating, having a thickness of 5 to 25 microns deposited on and metallurgically bonded to said thin titanium nitride coating, said carbide coating having a Knoop hardness of 3600 to 3900 $HK_{50}$ and a surface finish of 0.2 to 0.5 micron.

9. The article of claim 8 where said titanium carbide coating has been chemically vapor deposited on said nitride.

10. The article of claim 8 where said carbide layer is fine grained with substantially all the grains being less than 0.5 micron in diameter.

11. A laminated wear-resistant article comprising:
a plain carbon steel substrate having no more than 0.8 weight percent carbon and essentially free of carbide forming elements;
a thin, dense, fine grained, nonporous continuous coating of titanium nitride having a thickness of about 1 to 5 microns deposited on said substrate; and
a thin, continuous, smooth, fine grained titanium carbide coating having a thickness of 5 to 25 microns deposited on and metallurgically bonded to said titanium nitride coating, a substantial portion of the grains of said carbide being less than 0.5 micron in diameter, said carbide coating having a Knoop hardness of 3600 to 3900 $HK_{50}$ and a surface finish of 0.20 to 0.5 micron.

12. The article of claim 11 in the form of a pig-tail thread guide.

13. A laminated wear-resistant article comprising:
a plain carbon steel substrate having no more than 0.8 weight percent carbon and essentially free of carbide forming elements;
a thin, dense, continuous coating of titanium nitride having a thickness of about 1 to 5 microns deposited on and metallurgically bonded to said substrate; and
a thin, continuous, smooth titanium carbide coating, having a thickness of 5 to 25 microns deposited on and metallurgically bonded to said thin titanium nitride coating.

* * * * *

UNITED STATES PATENT AND TRADEMARK OFFICE
CERTIFICATE OF CORRECTION

PATENT NO. : 3,959,557
DATED : May 25, 1976
INVENTOR(S) : Alan R. Berry

It is certified that error appears in the above-identified patent and that said Letters Patent are hereby corrected as shown below:

Column 4, line 1, "or" should read -- of --;

Column 6, line 9, "threaded" should read -- thread --;

Column 7, line 22, "coating" should read -- coatings --;

Column 8, line 7, "$NK_{50}$" should read -- $HK_{50}$ --.

Signed and Sealed this

Eighth Day of March 1977

[SEAL]

Attest:

RUTH C. MASON
*Attesting Officer*

C. MARSHALL DANN
*Commissioner of Patents and Trademarks*